United States Patent
Irumata et al.

(10) Patent No.: US 7,241,368 B2
(45) Date of Patent: Jul. 10, 2007

(54) HAFNIUM SILICIDE TARGET FOR GATE OXIDE FILM FORMATION AND ITS PRODUCTION METHOD

(75) Inventors: Shuichi Irumata, Ibaraki (JP); Ryo Suzuki, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 123 days.

(21) Appl. No.: 10/362,044

(22) PCT Filed: Jun. 5, 2002

(86) PCT No.: PCT/JP02/05546

§ 371 (c)(1),
(2), (4) Date: Feb. 19, 2003

(87) PCT Pub. No.: WO03/006702

PCT Pub. Date: Jan. 23, 2003

(65) Prior Publication Data

US 2003/0155229 A1    Aug. 21, 2003

(30) Foreign Application Priority Data

Jul. 9, 2001    (JP)    ............................. 2001-207771
Apr. 9, 2002    (JP)    ............................. 2002-105897

(51) Int. Cl.
*C23C 14/34*    (2006.01)

(52) U.S. Cl. ........................... 204/298.13; 204/298.12; 419/38; 419/48; 419/49

(58) Field of Classification Search ........... 204/298.12, 204/298.13; 419/38, 48, 49
See application file for complete search history.

(56) References Cited

U.S. PATENT DOCUMENTS

| 4,619,697 A | * | 10/1986 | Hijikata et al. | ................ | 75/230 |
| 5,409,517 A | | 4/1995 | Satou et al. | .................. | 75/228 |
| 5,418,071 A | | 5/1995 | Satou et al. | ................. | 428/552 |
| 5,458,697 A | | 10/1995 | Ishigami et al. | ............. | 148/212 |
| 5,464,520 A | * | 11/1995 | Kano et al. | ............ | 204/298.13 |
| 6,562,207 B1 | * | 5/2003 | Ivanov | .................. | 204/298.13 |
| 2002/0179195 A1 | | 12/2002 | Oda et al. | .................... | 148/421 |

FOREIGN PATENT DOCUMENTS

| JP | 04-358030 | 12/1992 |
| JP | 05-214523 | 8/1993 |
| JP | 08-020863 | 1/1996 |
| JP | 2002-083955 | 3/2002 |
| WO | WO 91/18125 | 11/1991 |

OTHER PUBLICATIONS

Patent Abstracts of Japan, One page English Abstract of JP 08-020863.
Patent Abstracts of Japan, One page English Abstract of JP 08-020863 of Jan. 1996.

* cited by examiner

*Primary Examiner*—Rodney G. McDonald
(74) *Attorney, Agent, or Firm*—Howson & Howson LLP

(57) ABSTRACT

The present invention relates to a hafnium silicide target for forming a gate oxide film composed of $HfSi_{0.05-0.37}$. Obtained is a hafnium silicide target superior in workability and embrittlement resistance, and suitable for forming a HfSiO film and HfSiON film that may be used as a high dielectric gate insulation film in substitute for a $SiO_2$ film, and the manufacturing method thereof.

10 Claims, No Drawings

HAFNIUM SILICIDE TARGET FOR GATE OXIDE FILM FORMATION AND ITS PRODUCTION METHOD

TECHNICAL FIELD

The present invention relates to a hafnium silicide target superior in workability and embrittlement resistance, and suitable for forming a HfSiO film and HfSiON film that may be used as a high dielectric gate insulation film, and the manufacturing method thereof. Moreover, the unit of "ppm" as used in this specification shall mean wtppm in all cases.

BACKGROUND ART

The film thickness of a dielectric gate insulation film is largely influenced by the performance of a MOS transistor, and it is essential that the interface with the silicon substrate is electrically smooth and that the mobility of the carrier does not deteriorate.

Conventionally, a $SiO_2$ film has been used as this gate insulation film, and was the most superior in terms of interfacial quality. In addition, there is a characteristic in that the thinner the $SiO_2$ film used as this gate insulation film, the number of carriers (that is, electrons or electron holes) increases, and the source-drain current also increases thereby.

From the foregoing circumstances, each time the power supply voltage would decrease as a result of miniaturizing the wiring, the gate $SiO_2$ film has been consistently formed as thin as possible within a range that would not deteriorate the reliability of dielectric breakdown. Nevertheless, a tunnel leakage current flows directly when the gate $SiO_2$ film is formed of a thickness of 3 nm or less, and a problem arises in that this film would not function as an insulation film.

Meanwhile, although attempts are being made to miniaturize the transistor, so as long as there are limitations in the film thickness of the $SiO_2$ film, which is the gate insulation film as described above, miniaturization of the transistor loses its significance, and a problem arises in that the performance is not improved.

Moreover, in order to lower the power supply voltage of the LSI as well as lower the power consumption, it is necessary to make the gate insulation film even thinner. Nevertheless, since there is a problem regarding the gate dielectric breakdown when the film thickness of the $SiO_2$ film is made 3 nm or less as described above, thinning of the film had a limitation in itself.

In light of the foregoing circumstances, a high dielectric gate insulation film is being considered lately as a substitute for the $SiO_2$ film. And, the HfSiO film and HfSiON film are attracting attention as this type of high dielectric gate insulation film.

This high dielectric gate insulation film is capable of acquiring, with a comparatively thick film, a capacity equivalent to the $SiO_2$ film, and is characterized in that it is able to suppress the tunnel leakage current. Further, since this can be deemed as a film in which $SiO_2$ or SiOn is added to Hf, interfacial quality similar to that of $SiO_2$ can be expected.

Thus, sought is a sputtering target capable of easily and stably forming a high-grade HfSiO and HfSiON high dielectric gate insulation film.

DISCLOSURE OF THE INVENTION

In order to overcome the foregoing problems, the present invention aims to provide a hafnium silicide target superior in workability and embrittlement resistance, and suitable for forming a HfSiO film and HfSiON film that may be used as a high dielectric gate insulation film in substitute for a $SiO_2$ film, and the manufacturing method thereof. The present invention provides:

1. A hafnium silicide target for forming a gate oxide film composed of $HfSi_{0.05-0.37}$;
2. A hafnium silicide target for forming a gate oxide film composed of $HfSi_{0.05-0.37}$ and containing a compatible phase principally including a $Hf_2Si$ phase and a Hf phase;
3. A hafnium silicide target for forming a gate oxide film according to claim 1 or claim 2, wherein the relative density is 95% or more;
4. A hafnium silicide target for forming a gate oxide film according to each of claims 1 to 3, wherein the oxygen content is 500 to 10000 ppm;
5. A hafnium silicide target for forming a gate oxide film according to each of claims 1 to 4, wherein the zirconium content is 2.5 wt % or less;
6. A hafnium silicide target for forming a gate oxide film according to each of claims 1 to 5, wherein the impurities are C: 300 ppm or less, Ti: 100 ppm or less, Mo: 100 ppm or less, W: 10 ppm or less, Nb: 10 ppm or less, Fe: 10 ppm or less, Ni: 10 ppm or less, Cr: 10 ppm or less, Na: 0.1 ppm or less, K: 0.1 ppm or less, U: 0.01 ppm or less, and Th: 0.01 ppm or less;
7. A hafnium silicide target for forming a gate oxide film according to each of claims 1 to 6, wherein the average grain size is 5 to 200 μm; and
8. A manufacturing method of a hafnium silicide target for forming a gate oxide film, wherein powder of the composition composed of $HfSi_{0.05-0.37}$ is synthesized and thereafter hot pressed at 1700° C. to 1830° C.

BEST MODE FOR CARRYING OUT THE INVENTION

A high dielectric gate insulation film comprising the quality as a substitute for the $SiO_2$ film is formed by performing oxygen reactive sputtering to a HfSi target. This oxide film is considered to be a hybridization of an oxide film as represented with $HfO_2 \cdot SiO_2$ or a film in which a part of the oxygen is replaced with nitrogen, and a target was usually demanded of a composition of Si/Hf=1.0. Nevertheless, pursuant to the development of $HfO_2 \cdot SiO_2$, a composition even richer in Hf is in demand.

Thus, a method was attempted in which the amount of silicon is reduced in relation to Hafnium and performing sintering thereto. When sintering is conducted with such reduced amount of silicon, mixed crystals such as $Hf_5Si_4$ ($HfSi_{0.8}$), $Hf_3Si_2$ ($HfSi_{0.67}$) and $Hf_2Si$ ($HfSi_{0.5}$) are formed, and there is a problem in that these hafnium silicide inter compounds are not able to obtain sufficient density increase during the sintering since they have a high melting point, become a sintered body of a porous texture, and thereafter become a target with numerous generation of particles.

Upon persevering to improve the increase in density, the present invention succeeded in obtaining a target suitable as a hafnium silicide target for forming a gate oxide film.

The present invention is a hafnium silicide target for forming a gate oxide film composed of $HfSi_{0.05-0.37}$. This hafnium silicide target contains a compatible phase principally including a $Hf_2Si$ phase and a Hf phase, porous textures disappeared, and thereby obtained was a hafnium target having a relative density of 95% or more.

When the relative density becomes less than 95%, the brittleness deteriorates due to the lack of density, and the workability also deteriorates thereby. This also generates the increase of particles caused by the fracture and scattering of fragile crystals. It is therefore preferable that the relative density be within the foregoing range.

It is desirable that the oxygen content within the hafnium silicide target for forming the gate oxide film be 500 to 10000 ppm. When oxygen is less than 500 ppm, there is a possibility that the target will ignite during the manufacture thereof, and, contrarily, when oxygen exceeds 10000 ppm, oxygen within the target will deposit as an oxide and cause abnormal discharge during the sputtering, particles will increase thereby, and the product yield rate will decrease as a result thereof.

Further, it is preferable that the zirconium content within the target be controlled to 2.5 wt % or less. When the amount of zirconium exceeds 2.5 wt %, process conditions such as voltage, current and substrate temperature during the reactive sputtering for forming the oxide film will vary greatly, and this is not preferable.

Moreover, it is preferable that impurities within the hafnium silicide target for forming the gate oxide film are C: 300 ppm or less, Ti: 100 ppm or less, Mo: 100 ppm or less, W: 10 ppm or less, Nb: 10 ppm or less, Fe: 10 ppm or less, Ni: 10 ppm or less, Cr: 10 ppm or less, Na: 0.1 ppm or less, K: 0.1 ppm or less, U: 1.01 ppm or less, and Th: 1.01 ppm or less. This is because these impurities will become the contamination source to the gate electrode and lower Si substrate.

In order to manufacture a hafnium silicide target for forming a gate oxide film superior in brittleness resistance composed of $HfSi_{0.05-0.37}$, powder of the composition composed of $HfSi_{0.05-0.37}$ is combined and thereafter hot pressed at 1700° C. to 1830° C.

Upon combining the powder of the composition composed of $HfSi_{0.05-0.37}$, metal hydride hafnium powder and Si powder are prepared and mixed at a molar ratio of 1:0.05 to 1:0.37, and thereafter sintered at 600° C. to 800° C.

Although the use of Hf powder may also be considered, Hf powder is not preferable since it has strong oxidizability, and, when pulverized, there is a problem in that it may ignite.

Therefore, hafnium hydride is used for preventing this kind of ignition. Hafnium hydride powder is used upon being pulverized to have an average grain size of 20 µm or less. The use of this fine powder enables the realization of high density at the time of sintering.

Dehydrogenation and silicide formation are conducted with the heating process during the sintering described above. Dehydrogenation begins to occur from around 600° C. Although sintering is conducted under a vacuum ($1 \times 10^{-4}$ to $1 \times 10^{-2}$ Torr), it becomes a slight hydrogen atmosphere for dehydrogenation.

Moreover, dehydrogenation is completed upon heating to a temperature of 800° C., and, the portion that may ignite with the Hf metal is formed into a silicide, or sintered to a degree without any fear of ignition (approximately 3 µm or larger).

As described above, by conducting dehydrogenation and forming a silicide at a low temperature during the thermal synthesis, grain growth can be suppressed, primary grain of the sintered powder remains fine, and may be made into a high density during molding. If the sintered powder becomes coarse, pulverization before sintering becomes difficult, and results in residual coarse particles and decrease in density.

Accordingly, a significant characteristic is yielded in that the crystal grain growth can be suppressed since sintering is conducted at a low temperature, and the average crystal grain size of the hafnium silicide target for forming a gate oxide film can be made to be 5 to 200 µm. And, high densification can be achieved upon sintering.

With a target having an average crystal grain size of less than 5 µm, it is difficult to make the amount of oxygen 10000 ppm or less, and there is a fear of ignition during the manufacturing process. Moreover, when the average crystal grain size exceeds 200 µm, since particles will increase and the production yield rate will deteriorate, it is desirable that the average crystal grain size be set between 5 and 200 µm as described above.

High densification during sintering is enabled through the synthesis of the powder composed from the foregoing $HfSi_{0.05-0.37}$ and hot pressing this at 1700° C. to 1830° C.

The foregoing hot pressing temperature is a temperature immediately under the liquid phase generation of the synthesized powder, and this temperature range is important for the sintering. This enables the realization of a high density hafnium silicide target having a relative density of 95% or more.

The high density hafnium silicide target of the present invention yields an effect in preventing the generation of particles caused by the pores during sputtering.

EXAMPLES

Next, the Examples are explained. Further, these Examples are merely illustrative, and the present invention shall in no way be limited thereby. In other words, the present invention shall include all other modes or modifications other than these Examples within the scope of the technical spirit of this invention.

Example 1

A synthesized powder of $HfSi_{0.32}$ was obtained by mixing $HfH_2$ powder and Si powder and heating this at 800° C. in a vacuum, whereby dehydrogenation reaction and silicide synthetic reaction were conducted at once. This hafnium silicide powder was pulverized to obtain hafnium silicide powder of −200 mesh. It has been confirmed with XRD that this hafnium silicide powder is composed of a compatible phase principally including a $Hf_2Si$ phase and a Hf phase.

A sintered body having a density of 99.7% was obtained by hot pressing this silicide powder under the condition of 300 kg/cm²×2 hours at 1800° C. This was further machine processed to prepare a target of φ 300 mm×6.35 mmt. Texture with hardly any pores was obtained thereby.

Sputtering was performed to the target prepared as described above, and, upon measuring the particles on a 6-inch wafer, only a total of 24 particles having a measurement of 0.2 µm or larger were found, and the generation of particles decreased considerably.

A hafnium silicide target superior in workability and embrittlement resistance was obtained as a result of the above. Further, since this target may be employed in wet processing, there is no longer any fear of ignition during the processing.

Example 2

A synthesized powder of HfSi$_{0.25}$ was obtained by mixing HfH$_2$ powder and Si powder and heating this at 800° C. in a vacuum, whereby dehydrogenation reaction and silicide synthetic reaction were conducted at once. This silicide powder was pulverized to obtain hafnium silicide powder of −200 mesh. It has been confirmed with XRD that this hafnium silicide powder is composed of a compatible phase principally including a Hf$_2$Si phase and a Hf phase.

A sintered body having a density of 99.8% was obtained by hot pressing this hafnium silicide powder under the condition of 300 kg/cm$^2$×2 hours at 1800° C. This was further machine processed to prepare a target of φ 300 mm×6.35 mmt. Sputtering was performed to the hafnium sputtering target prepared as described above, and, upon measuring the particles on a 6-inch wafer, only a total of 30 particles having a measurement of 0.2 μm or larger were found, and the generation of particles decreased considerably.

A hafnium silicide target superior in workability and embrittlement resistance was obtained as a result of the above. Further, there is no longer any fear of ignition during the processing.

Comparative Example 1

A synthesized powder of HfSi$_{0.42}$ was obtained by mixing HfH$_2$ powder and Si powder and heating this at 800° C. in a vacuum, whereby dehydrogenation reaction and silicide synthetic reaction were conducted at once. This silicide powder was pulverized to obtain hafnium silicide powder of −200 mesh. It has been confirmed with XRD that this hafnium silicide powder is composed of a compatible phase principally including a Hf$_2$Si phase and a Hf phase.

A sintered body was obtained by hot pressing this silicide powder under the condition of 300 kg/cm$^2$×2 hours at 1800° C. Although this hot pressing condition was the same as Example 1, the sintered body had a low density of 87.0%. This was further machine processed to prepare a target of φ 300 mm×6.35 mmt.

Sputtering was performed to the target prepared as described above, and, upon measuring the particles on a 6-inch wafer, a total of 310 particles having a measurement of 0.2 μm or larger were found. In addition, a plurality of protrusions referred to as nodules had generated on the outer peripheral face of the target.

Moreover, contamination with the processing fluid occurs when adopting the wet processing method, and, since this contamination cannot be removed in the subsequent processes, there is a problem in that it is not possible to obtain a target having the purity suitable for practical application.

Comparative Example 2

A synthesized powder of HfSi$_{0.7}$ was obtained by mixing HfH$_2$ powder and Si powder and heating this at 800° C. in a vacuum, whereby dehydrogenation reaction and silicide synthetic reaction were conducted at once. This silicide powder was pulverized to obtain hafnium silicide powder of −200 mesh. It has been confirmed with XRD that this hafnium silicide powder is composed of a compatible phase principally including a Hf$_2$Si$_3$ phase and some amount of Hf$_5$Si$_3$ phase.

A sintered body was obtained by hot pressing this hafnium silicide powder under the condition of 300 kg/cm$^2$×2 hours at 1800° C. Although this hot pressing condition was the same as Example 1, the sintered body had a low density of 80.0%. This was further machine processed to prepare a target of φ 300 mm×6.35 mmt.

Sputtering was performed to the target prepared as described above, and, upon measuring the particles on a 6-inch wafer, a total of 510 particles having a measurement of 0.2 μm or larger were found. In addition, a plurality of nodules had generated.

Moreover, as with Comparative Example 1, contamination with the processing fluid occurs when adopting the wet processing method, and, since this contamination cannot be removed in the subsequent processes, there is a problem in that it is not possible to obtain a target having the purity suitable for practical application.

The relative density of the targets in Examples 1 and 2 is 95% or more. Further, the number of particles was 35 or less. Improvement in the relative density was achieved similarly under the hot pressing conditions of 1700° C. to 1830° C. By reducing the Hf:Si ratio to 1:0.37 or less as described above, although the reason is not necessary clear, as illustrated in the Examples, it has been confirmed that the density of the sintered body can be improved stably.

Contrarily, the relative density in Comparative Example 1 was low at 87.0%. The result was inferior where the number of particles was 310 and nodules arose as a result thereof.

Moreover, the relative density in Comparative Example 2 was low at 80.0%. The result was inferior where the number of particles was 510 and nodules similarly arose as a result thereof.

Accordingly, superiority of the Examples according to the present invention is evident, and it is further clear that the present invention possesses superior characteristics.

EFFECT OF THE INVENTION

The present invention is characterized in that it is able to obtain a hafnium silicide target superior in workability and embrittlement resistance, and suitable for forming a HfSiO film and HfSiON film that may be used as a high dielectric gate insulation film in substitute for a SiO$_2$ film.

The present hafnium silicide target has a relative density of 95% or more, and possesses superior strength.

Moreover, the highly densified silicide target of the present invention is capable of preventing the generation of particles arising from pores during the sputtering and the generation of particles resulting from the fracture and scattering of brittle textures, and yields a significant advantage in that it does not ignite during the processing or manufacturing process of the target.

The invention claimed is:

1. A hafnium silicide target for forming a gate oxide film composed of HfSi$_{0.05-0.37}$, said target having a texture composed of a compatible phase consisting essentially of a Hf$_2$Si phase and a Hf phase, said target having an oxygen content of 500 to 10,000 ppm, and said target being obtained by mixing a hathium hydride powder with a silicon powder in a molar ratio of 1:0.05 to 1:0.37, sintering said hafnium hydride powder and silicon powder mixture at 600 to 800° C. to obtain a hafnium silicide powder formed from a compatible phase principally including a Hf$_2$Si phase and a Hf phase, and hot pressing said hafnium silicide powder.

2. A hafnium silicide sputtering target according to claim 1, wherein said target has a relative density of 95% or more.

3. A hafnium suicide sputtering target according to claim 1, wherein said target has a zirconium content of 2.5 wt % or less.

4. A hafnium silicide sputtering target according to claim 1, wherein said target has impurities including 300 ppm or less of C, 100 ppm or less of Ti, 100 ppm or less of Mo, 10 ppm or less of W, 10 ppm or less of Nb, 10 ppm or less of Fe, 10 ppm or less of Ni, 10 ppm or less of Cr, 0.1 ppm or less of Na, 0.1 ppm or less of K, 0.01 ppm or less of U, and 0.01 ppm or less of Th.

5. A hafnium silicide sputtering target according to claim 1, wherein said target has an average grain size of 5 to 200 µm.

6. A hafnium silicide sputtering target according to claim 2, wherein said target has a zirconium content of 2.5 wt % or less.

7. A hafnium silicide sputtering target according to claim 6, wherein said target has impurities including 300 ppm or less of C, 100 ppm or less of Ti, 100 ppm or less of Mo, 10 ppm or less of W, 10 ppm or less of Nb, 10 ppm or less of Fe, 10 ppm or less of Ni, 10 ppm or less of Cr, 0.1 ppm or less of Na, 0.1 ppm or less of k, 0.01 ppm or less of U, and 0.01 ppm or less of Th, and wherein said target has an average grain size of 5 to 200 µm.

8. A hafnium suicide sputtering target according to claim 7, wherein said target has an average grain size of 5 to 200 µm.

9. A hafnium suicide sputtering target for forming a gate oxide film prepared by a process comprising the steps of:
  mixing a hafnium hydride powder with a silicon powder in a molar ratio of 1:0.05 to 1:0.37;
  sintering said hafnium hydride powder and silicon powder mixture at 600 to 800° C. to obtain a hafnium silicide powder of a composition $HfSi_{0.050-0.37}$ composed of a compatible phase consisting essentially of a $Hf_2Si$ phase and a Hf phase;
  pulverizing said hafnium suicide powder; and
  thereafter hot pressing said hafnium silicide powder at 1700° C. to 1830° C. to form a hafnium suicide target having a texture composed of a compatible phase consisting essentially of a $Hf_2Si$ phase and a Hf phase and having an oxygen content of 500 to 10,000 ppm.

10. A metal suicide sputtering target for forming a gate oxide film, comprising:
  a hafnium silicide sputtering target composed of $HfSi_{0.05-0.37}$ and having phases consisting essentially of a $Hf_2Si$ phase and a Hf phase and being without mixed crystals of $Hf_5Si_4$ and $Hf_3Si_2$;
  said hafnium silicide sputtering target having an oxygen content of 500 to 10,000 ppm, a zirconium content of 2.5 wt % or less, and an average grain size of 5 to 200 µm; and
  said hafnium silicide sputtering target being obtained by mixing a hafnium hydride powder with a silicon powder in a molar ratio of 1:0.05 to 1:0.37, sintering said hafnium hydride powder and silicon powder mixture at 600 to 800° C. to obtain a hafnium silicide powder formed from a $Hf_2Si$ phase and a Hf phase, and hot pressing said hafnium suicide powder at 1700° C. to 1830° C.

* * * * *